US012722493B1

(12) United States Patent
Al Alawy et al.

(10) Patent No.: US 12,722,493 B1
(45) Date of Patent: Sep. 1, 2026

(54) SYSTEM AND METHOD FOR DYNAMICALLY MANAGING CONNECTIVITY BETWEEN A VEHICLE AND AN EXTERNAL ECOSYSTEM

(71) Applicant: GM Global Technology Operations LLC, Detroit, MI (US)

(72) Inventors: Ahmed F. Al Alawy, Canton, MI (US); Azin Neishaboori, Plymouth, MI (US); Venkata Naga Siva Vikas Vemuri, Farmington Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 19/204,971

(22) Filed: May 12, 2025

(51) Int. Cl.

| | |
|---|---|
| ***H04L 69/08*** | (2022.01) |
| ***B60K 35/85*** | (2024.01) |
| ***G01R 31/36*** | (2020.01) |
| ***H04L 43/02*** | (2022.01) |
| ***H04L 47/762*** | (2022.01) |

(52) U.S. Cl.
CPC .............. *B60K 35/85* (2024.01); *G01R 31/36* (2013.01); *H04L 43/02* (2013.01); *H04L 47/762* (2013.01)

(58) Field of Classification Search
CPC ......... H04W 4/40; H04W 4/44; H04W 88/16; H04L 69/08; H04L 69/085; H04L 2012/40215; H04L 12/4625; H04L 43/02; H04L 47/762; B60K 35/85; G01R 31/36
See application file for complete search history.

(56) References Cited

U.S. PATENT DOCUMENTS

| | | | | |
|---|---|---|---|---|
| 2020/0259919 | A1* | 8/2020 | Lepp | H04W 4/44 |
| 2023/0315440 | A1* | 10/2023 | Clark | G06F 11/0751 |
| 2024/0127634 | A1 | 4/2024 | Turner et al. | |
| 2025/0343707 | A1* | 11/2025 | Srinivasan | G06F 21/64 |

FOREIGN PATENT DOCUMENTS

| | | | | |
|---|---|---|---|---|
| EP | 1197396 A2 * | 4/2002 | | H04L 67/12 |

* cited by examiner

*Primary Examiner* — Kenneth J Malkowski
(74) *Attorney, Agent, or Firm* — Vivacqua Crane, PLLC

(57) ABSTRACT

A method for dynamically managing connectivity between a vehicle and an external ecosystem includes establishing, by a connectivity hub module (CHM) located in the vehicle, an initial connectivity configuration, monitoring, by the CHM during an ongoing connectivity session between the vehicle and the external ecosystem, internal vehicle state data, applying, by the CHM, a dynamic rule set to at least one of the plurality of vehicle ECUs, generating a revised connectivity configuration based on application of the dynamic rule set, and re-allocating, using the revised connectivity configuration, the at least one vehicle ECU's network presence on the external ecosystem by updating the ECU's device-type designation on the external ecosystem.

20 Claims, 2 Drawing Sheets

SYSTEM AND METHOD FOR DYNAMICALLY MANAGING CONNECTIVITY BETWEEN A VEHICLE AND AN EXTERNAL ECOSYSTEM

INTRODUCTION

The present disclosure relates to a method and vehicle system that dynamically determines which vehicle devices may be controlled by external controllers when communicating with one or more Internet of Things (IoT) devices in an external ecosystem.

Connected vehicles are increasingly expected to integrate seamlessly with IoT devices, such as smart-home ecosystems, so that users can use vehicle devices when the user is not in the vehicle. For example, a user may want to use view vehicle-mounted cameras from a home assistant for security, or to trigger garage-door operation using the vehicle. Typically, these systems require each vehicle electronic control unit (ECU) of each vehicle device, such as cameras, alarms, and HVAC modules, to be pre-assigned a fixed "device type" or communication protocol (e.g., Matter, Zigbee, Wi-Fi, Bluetooth). Once paired, external controllers may communicate directly with those ECUs, possibly with little or no subsequent vehicle involvement. This static architecture poses several challenges, including connectivity management, feature prioritization, internal module usability, unmanaged cybersecurity exposure, uncontrolled data-flow that may jeopardize privacy, excessive battery drain when high-bandwidth links remain enabled, and an inability to accommodate over-the-air (OTA) updates.

Accordingly, there is a need for a method and vehicle system that can dynamically determine the communication protocol and connectivity path for each internal device when connecting to an external ecosystem.

SUMMARY

A method for dynamically managing connectivity between a vehicle and an external ecosystem is provided. The method includes establishing, by a connectivity hub module (CHM) located in the vehicle, an initial connectivity configuration in which each of a plurality of vehicle electronic control units (ECUs) is registered on the external ecosystem with an initial device-type designation and an initial connectivity path that is one of a direct communication, an indirect communication through the CHM or a gateway module in the vehicle, or no external communication, monitoring, by the CHM during an ongoing connectivity session between the vehicle and the external ecosystem, internal vehicle state data including at least a battery level, an over-the-air-update status, and a network traffic load, and monitoring external context data including at least an identity and a recent behavior of the external ecosystem, applying, by the CHM, a dynamic rule set to at least one of the plurality of vehicle ECUs, wherein the dynamic rule set determines which of the device-type designation and the connectivity path should be changed for the at least one vehicle ECU based on the internal vehicle state data and the external context data, generating a revised connectivity configuration based on application of the dynamic rule set, wherein the revised connectivity configuration includes a revised device-type designation corresponding to a different communications protocol than the initial communications protocol and/or a revised connectivity path chosen from the set of direct communication, indirect communication, or no external communication, and re-allocating, using the revised connectivity configuration, the at least one vehicle ECU's network presence on the external ecosystem by updating the ECU's device-type designation on the external ecosystem, and/or rerouting external messages destined for or originating from the at least one vehicle ECU through the CHM or the gateway module acting as a protocol bridge for when the connectivity path chosen is indirect communication.

In one aspect, when the revised connectivity path is set as indirect, the method further includes translating, by the CHM or the gateway module, messages exchanged between the external ecosystem and the ECU between a first protocol used by the external ecosystem and a second protocol used within a vehicle network.

In another aspect, the monitoring further comprises detecting that at least one threshold condition has been met in the internal vehicle state data.

In another aspect, the threshold condition is the battery level falling below a predefined battery limit.

In another aspect, the threshold is the network-traffic load exceeding a predefined traffic limit.

In another aspect, the threshold is the initiation of the over-the-air-update for the at least one vehicle ECU.

In another aspect, the internal vehicle state data indicates that the at least one vehicle ECU is undergoing an over-the-air-update and the dynamic rule set selects the revised connectivity path as no external communication for the at least one vehicle ECU until the update is complete.

In another aspect, wherein the external context data further comprise a trust score for the external ecosystem.

In another aspect, the dynamic rule set selects the revised connectivity path as indirect communication through the CHM or the gateway module when the trust score is below a predefined trust threshold.

A system in a vehicle for dynamically managing connectivity between the vehicle and an external ecosystem is also provided. The system includes a plurality of vehicle ECUs, a gateway module in communication with at least one of the plurality of ECUs, and a connectivity hub module (CHM) in communication with the plurality of vehicle ECUs. The CHM is configured to establish an initial connectivity configuration in which each of a plurality of vehicle electronic control units (ECUs) is registered on the external ecosystem with an initial device-type designation and an initial connectivity path that is one of a direct communication, an indirect communication through the CHM or a gateway module in the vehicle, or no external communication, monitor, during an ongoing connectivity session between the vehicle and the external ecosystem, an internal vehicle state data including at least a battery level, an over-the-air-update status, and a network traffic load, and monitoring external context data including at least an identity and a recent behavior of the external ecosystem, apply a dynamic rule set to at least one of the plurality of vehicle ECUs, wherein the dynamic rule set determines which of the device-type designation and the connectivity path should be changed for the at least one vehicle ECU based on the internal vehicle state data and the external context data, generate a revised connectivity configuration based on application of the dynamic rule set, wherein the revised connectivity configuration includes a revised device-type designation corresponding to a different communications protocol than the initial communications protocol and/or a revised connectivity path chosen from the set of direct communication, indirect communication, or no external communication, and re-allocate, using the revised connectivity configuration, the at least one vehicle ECU's network presence on the external ecosystem by updating the ECU's device-type designation on the external ecosystem, and/or rerouting external messages destined for or originating from the at least one vehicle ECU through the CHM or the gateway module acting as a protocol bridge for when the connectivity path chosen is indirect communication.

In one aspect, when the revised connectivity path is indirect communication, the CHM or the gateway module is further configured to translate messages exchanged between the external ecosystem and the at least one ECU between a first protocol used by the external ecosystem and a second protocol used within the vehicle network.

In another aspect, the CHM is further configured to detect that at least one threshold condition has been met in the internal vehicle state data.

In another aspect, the threshold condition comprises the battery level falling below a predefined battery limit.

In another aspect, the threshold condition comprises the network-traffic load exceeding a predefined traffic limit.

In another aspect, the threshold condition comprises initiation of an over-the-air update for the at least one ECU.

In another aspect, when the internal vehicle state data indicate that the at least one ECU is undergoing an over-the-air update, the dynamic rule set selects the revised connectivity path as no external communication for the at least one ECU until the update is complete.

In another aspect, the external context data further comprise a trust score for the external ecosystem, and the dynamic rule set selects the revised connectivity path as indirect communication through the CHM or the gateway module when the trust score is below a predefined trust threshold.

A tangible, non-transitory, machine-readable medium, comprising machine-readable instructions is also provided, When executed by a processor, the machine-readable instructions cause the processor to: establish, by a connectivity hub module (CHM) located in a vehicle, an initial connectivity configuration in which each of a plurality of vehicle electronic control units (ECUs) is registered on an external ecosystem with an initial device-type designation and an initial connectivity path that is one of a direct communication, an indirect communication through the CHM or a gateway module in the vehicle, or no external communication, monitor, by the CHM during an ongoing connectivity session between the vehicle and the external ecosystem, an internal vehicle state data including at least a battery level, an over-the-air-update status, and a network traffic load, and monitoring external context data including at least an identity and a recent behavior of the external ecosystem, apply, by the CHM, a dynamic rule set to at least one of the plurality of vehicle ECUs, wherein the dynamic rule set determines which of the device-type designation and the connectivity path should be changed for the at least one vehicle ECU based on the internal vehicle state data and the external context data, generate a revised connectivity configuration based on application of the dynamic rule set, wherein the revised connectivity configuration includes a revised device-type designation corresponding to a different communications protocol than the initial communications protocol and/or a revised connectivity path chosen from the set of direct communication, indirect communication, or no external communication, and re-allocate, using the revised connectivity configuration, the at least one vehicle ECU's network presence on the external ecosystem by updating the ECU's device-type designation on the external ecosystem, and/or rerouting external messages destined for or originating from the at least one vehicle ECU through the CHM or the gateway module acting as a protocol bridge for when the connectivity path chosen is indirect communication.

In one aspect, the machine-readable medium causes the processor to translate messages exchanged between the external ecosystem and the at least one ECU between a first protocol used by the external ecosystem and a second protocol used within the vehicle network when the revised connectivity path is indirect communication.

In another aspect, the machine-readable medium causes the processor to detect that at least one threshold condition has been met in the internal vehicle state data and the external context data.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
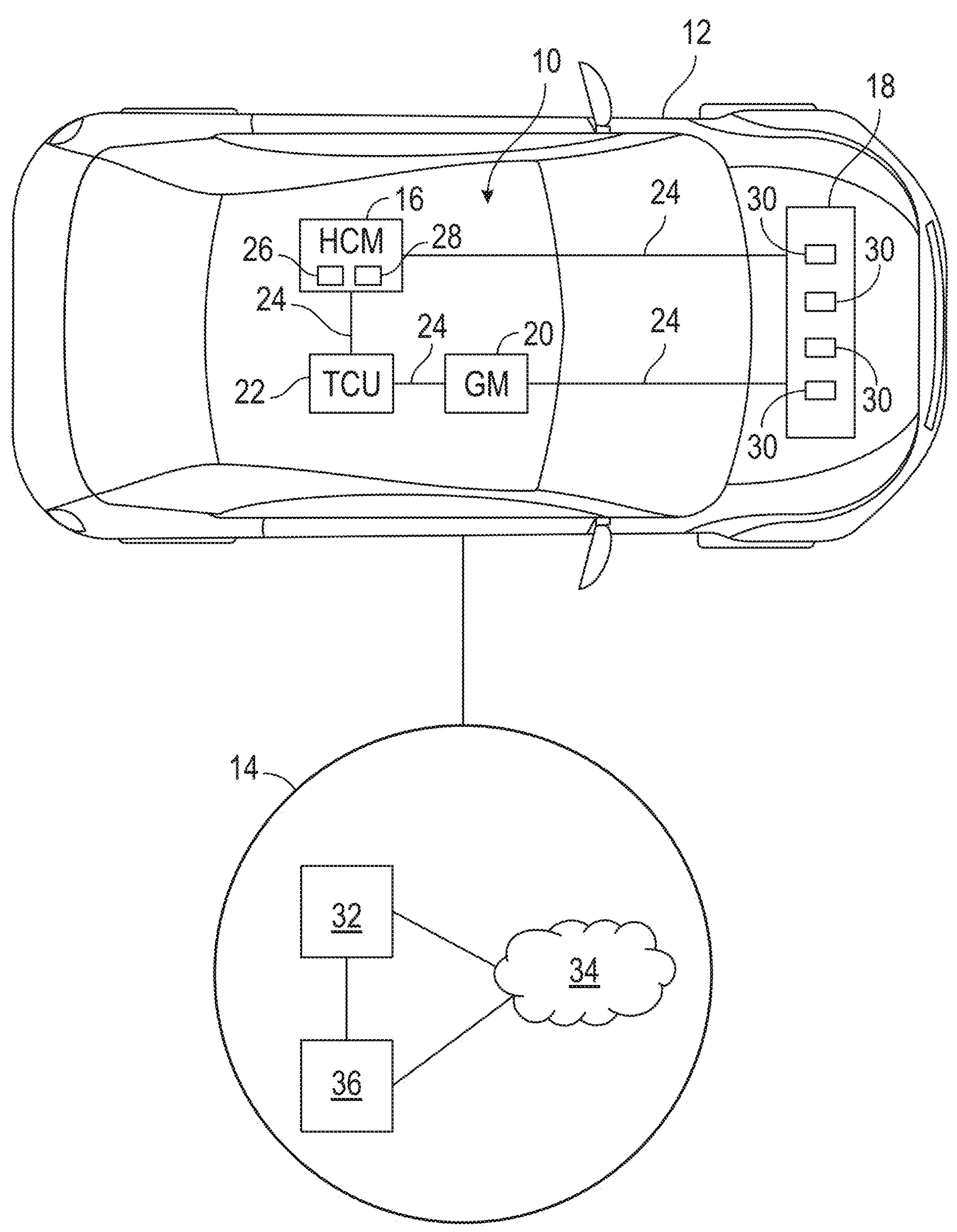
FIG. 1 is a schematic diagram of a vehicle in electronic communication with one or more external ecosystems, according to an exemplary embodiment.

Referring to FIG. 1, a schematic diagram of a system 10 within a vehicle 12 for dynamically managing connectivity between the vehicle 12 and an external ecosystem 14 is shown. It is to be appreciated that the vehicle 12 may be any type of vehicle such as, but not limited to, a sedan, a truck, sport utility vehicle, van, or motor home. The system 10 generally includes a connectivity hub module (CHM) 16, a plurality of vehicle devices 18, a gateway module 20, and a telematics control unit (TCU) 22.

The CHM 16 is configured to dynamically apply a dynamic rule set to one or more of the plurality of vehicle devices 18, as will be described in greater detail below. The CHM 16 is in electronic communication with the plurality of vehicle devices 18 and the TCU 22 via a vehicle network 24 (CAN, Ethernet, LIN, etc.). The CHM 16 is a controller that generally includes at least one vehicle processor 26 and a vehicle non-transitory computer readable storage device or media 28. The vehicle processor 26 may be a custom-made processor, a central processing unit (CPU), a graphics processing unit (GPU), an auxiliary processor, a semiconductor-based microprocessor (in the form of a microchip or chip set), a macroprocessor, a combination thereof, or generally a device for executing instructions. The vehicle non-transitory computer readable storage device or media 28 may include volatile and nonvolatile storage in read-only memory (ROM), random-access memory (RAM), and keep-alive memory (KAM), for example. KAM is a persistent or non-volatile memory that may be used to store various operating variables while the vehicle processor 26 is powered down. A "non-transitory" computer readable medium excludes wired, wireless, optical, or other communication links that transport transitory electrical or other signals. A "non-transitory" computer readable medium includes media where data can be permanently stored and media where data can be stored and later overwritten, such as a rewritable optical disc or an erasable memory device. The vehicle non-transitory computer-readable storage device or media 28 may be implemented using a number of memory devices such as PROMs (programmable read-only memory), EPROMs (electrically PROM), EEPROMs (electrically erasable PROM), flash memory, or another electric, magnetic, optical, or combination memory devices capable of storing data, some of which represent executable instructions, used by the processor 26 in controlling the vehicle 12. The processor 26 of the vehicle 12 may be programmed to execute the method 100 described in detail below.

The executable instructions may include one or more separate programs, each of which comprises an ordered listing of executable instructions for implementing logical functions. The instructions, when executed by the processor 26, receive and process signals from the plurality of vehicle devices 18, perform logic, calculations, methods and/or algorithms for automatically controlling the components of the vehicle 12, and generate control signals to actuator systems to automatically control the components of the vehicle 12 based on the logic, calculations, methods, and/or algorithms.

Although a single CHM 16 is shown in FIG. 1, embodiments of the system 10 may include a plurality of CHMs 16 or a plurality of other processors and controllers that communicate over a suitable communication medium or a combination of communication mediums and that cooperate to process the sensor signals, perform logic, calculations, methods, and/or algorithms, and generate control signals to automatically control features of the vehicle 12.

The CHM 16 may have integrated communications on board a printed circuit board or an attached RF sub-assembly, in which case the CHM 16 is configured to communicate wirelessly using various protocols (Wi-Fi, Matter, Thread, Bluetooth, LTE/5G, etc.). Alternatively, the CHM 16 may use an in-vehicle communication link, such as the TCU 22, to communicate wirelessly.

The plurality of vehicle devices 18 are connected to the vehicle network 24 and include any vehicle component configured to either capture data regarding components of the vehicle 12, physical states of the vehicle 12, environmental conditions of the vehicle 12, or to communicate or take action within the vehicle 12. For example, the plurality of vehicle devices 18 includes perception sensors such as cameras, an inertial measurement unit (IMU), a global positioning system (GPS), radar, and LiDAR, environment sensors such as temperature sensors, battery state of charge sensors, speed sensors, moisture sensors, barometric pressure sensors, as well as infotainment modules, body/engine control modules, advance drivers assistance systems, displays or human machine interfaces, door or window controllers, garage door controls, etc. Therefore, a subset of the plurality of vehicle devices 18 includes one or more vehicle electronic control units (ECUs) 30. The vehicle ECUs 30 are controllers having a processor and memory, and are specific to the type of device associated therewith. Individual vehicle ECU's 30 may communicate with the CHM 16 or with the TCU 22 via the gateway module 20, or may have their own (on device) wireless communication capability.

The gateway module 20 is generally a controller having a processor and non-transitory memory distinct from the CHM 16. The gateway module 20 is any in-vehicle electronic module that may be used to relay or translate communications between one or more of the vehicle ECUs 30 and the external ecosystem 14. The gateway module 20 generally includes two communications interfaces: one facing the external ecosystem 14 (e.g., Wi-Fi, Bluetooth, Thread) and one facing the internal vehicle domain via the vehicle network 24. The gateway module 20 is configured to forward traffic between the external ecosystem 14 and the vehicle network 24 when direct vehicle ECU 30 exposure is undesirable. The gateway module 20 may also translate protocols by converting one protocol, such as Wi-Fi packets from the external ecosystem 14, into another protocol, such as CAN. The gateway module 20 may have wireless communication integrated therein, or may use the TCU 22 for communication.

The TCU 22 is connected to the vehicle network 24 and is an on-board communications gateway that integrates cellular, GNSS (GPS), Wi-Fi/Bluetooth radios with a controller to exchange data between the vehicle 12 and external servers or devices, other vehicles ("V2V" communication,) infrastructure ("V2I" communication), and the external ecosystem 14. The TCU 22 may communicate via a wireless local area network (WLAN) using IEEE 802.11 standards or by using cellular data communication and/or dedicated short-range communications (DSRC) channels. DSRC channels refer to one-way or two-way short-range to medium-range wireless communication channels specifically designed for automotive use and have a corresponding set of protocols and standards.

The external ecosystem 14 is any networked environment outside the vehicle 12 (i.e. not physically connected), such as a smart-home or smart-building network, public hotspot, or roadside infrastructure, that includes one or more external controllers 32, cloud services 34, and third-party internet-of-things (IoT) devices 36 capable of discovering, pairing with, and issuing commands to the vehicle ECUs 30 using a communication protocol. The communication protocol may include Matter, Thread, Zigbee, Wi-Fi, Bluetooth, or cellular. Additional communication protocols may also be used. The controllers 32 may include personal communication devices, such as phones or smart home assistants. The cloud services may include ONSTAR or other emergency or repair services. The IoT devices 36 may include smart home devices such as smart thermostats, smart locks, virtual assistants, smart doorbell cameras, smart wearable devices such as fitness trackers and electrocardiogram (ECG) monitors, and smart consumer devices such as smart refrigerators, smart coffeemakers, and smart washing machines. Other examples include smart parking meters and IoT beacons in found in establishments such as grocery stores, clothing stores, and malls, and smart traffic lights.

In one non-limiting embodiment, the external ecosystem 14 is a personal residence of a user of the vehicle 12. In another example, the external ecosystem 14 is a commercial establishment open to the public for carrying out commercial activities such as, but not limited to, a restaurant, a retail store, a financial institution, a supermarket, an automobile dealership or service shop, a storage locker for securing goods purchased online, a gym, a salon or barbershop, and medical establishments such as a dentist or physician's office or a hospital. In another embodiment, the external ecosystem 14 may be a government agency such as the department of motor vehicles (DMV).

Figure 2:
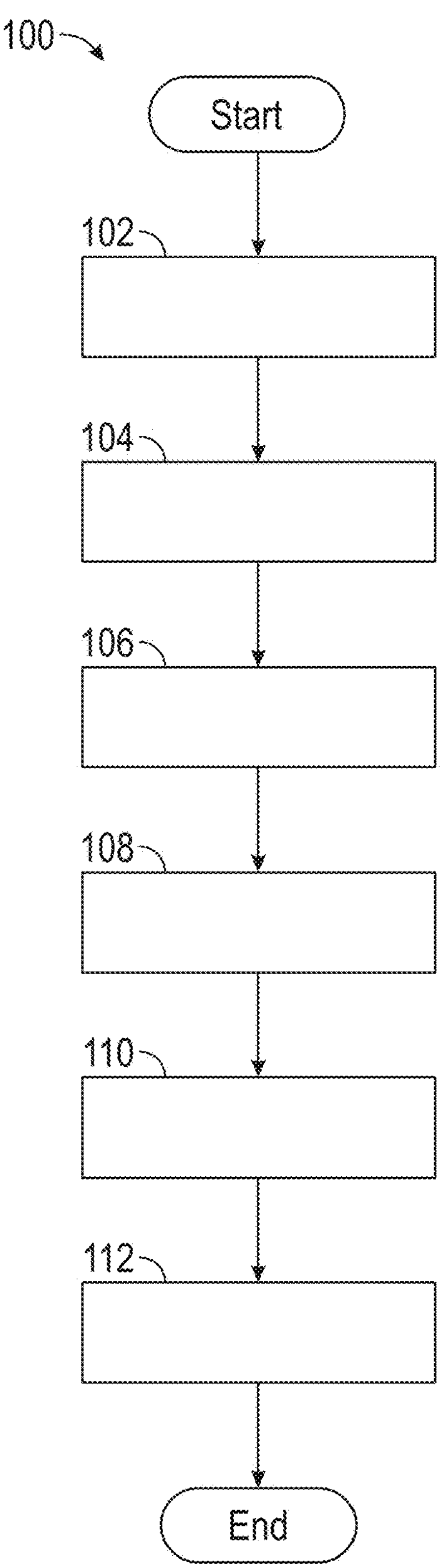
FIG. 2 is a flow chart illustrating a method for dynamically managing connectivity between the vehicle and the external ecosystem.

Turning now to FIG. 2, a method 100 for dynamically managing connectivity between the vehicle 12 and the external ecosystem 14 is shown.

At step 102, the CHM 16 establishes an initial or first connectivity configuration. The initial connectivity configuration sets an initial device-type designation (e.g. initial communications protocol) and an initial connectivity path. The initial device-type designation includes, for example, Wi-Fi, Bluetooth, Thread, Matter, Zigbee, Ethernet, or CAN. The initial connectivity path includes one of direct communication between the vehicle ECU 30 and the external ecosystem 14, indirect communication in which the CHM 16 or the gateway module 20 serves as a protocol bridge between the vehicle ECU 30 and the external ecosystem 14, or no external communication between the vehicle ECU 30 and the external ecosystem 14. The method 100 then proceeds to step 104.

At step 104, the vehicle 12 enters into a connectivity session with the external ecosystem 14. The connectivity session may be automatically initiated, or implemented by a user of the vehicle 12, or via a connection request from the external ecosystem 14. The CHM 16 registers at least one of the plurality of vehicle ECUs 30 on the external ecosystem 14 with the initial connectivity configuration. The method 100 then proceeds to step 106.

At step 106, during the ongoing connectivity session between the vehicle 12 and the external ecosystem 14, the CHM 16 continuously or periodically monitors internal vehicle state data and external context data. The internal vehicle state data is any data related to the condition or operation of the vehicle 12 that may impact which of the plurality of devices 30 may be accessed or used by the external ecosystem 14 without damaging or degrading performance of the vehicle 12. For example, the internal vehicle data may include, without limitation, a traction-battery or 12-V battery state-of-charge (monitored by a battery charge sensor), an over-the-air-update (OTA) status flag for each vehicle ECU 30, and an aggregate network-traffic load on an in-vehicle data bus. The external context data may include an identity of the external ecosystem 14 (e.g., “home garage,” “rental house,” or “public charger”) and a recent behavior history of that ecosystem—such as a calculated trust score derived from failed authentication attempts, anomalous message rates, or other security metrics. The method 100 then proceeds to step 108.

At step 108, the CHM 16 applies a dynamic rule set to one or more of the vehicle ECUs 30. The dynamic rule set is determined based on the internal vehicle state data and the external context data. The dynamic rule set changes one or both of the device-type designation and the connectivity path. The dynamic rule set may be implemented as static threshold logic, a finite-state machine, or an adaptive model (e.g., a machine-learning classifier). For example, rules compare the monitored parameters of the internal vehicle-state data and the external context data to predefined limits, such as a battery-level threshold, a network-traffic threshold, detection of an active OTA update, or a trust threshold. When any rule condition is satisfied or met, a revised device-type designation and/or a revised connectivity path for the affected ECU 30 is generated. For example, the threshold condition is met when the battery level falls below a predefined battery limit. In this condition, the dynamic rule set may set the device-type designation to a lower power communication protocol (e.g., switching from Matter to Thread). Where the current state of charge of the battery is below a second, lower predefined battery limit, the dynamic rule set may set the connectivity path to no external communication. The predefined battery thresholds are known to those skilled in the art.

In another example, the threshold condition is met when the network-traffic load exceeds a predefined traffic limit. In this condition, the dynamic rule set may set the device-type designation to a lower power communication protocol (e.g., switching from Matter to Thread). The predefined traffic limit is known to those skilled in the art.

In yet another example, the threshold condition is met when an over-the-air-update (OTA) for at least one vehicle ECUs 30 is initiated. In this condition, the dynamic rule set may set the connectivity path to no external communication. In this configuration, the method 100 manages vehicle power reserves and in-vehicle network bandwidth by selectively rewriting device routing tables on-chip, thereby reducing peak CAN-bus traffic during OTA events compared with static architectures.

In yet another example, the threshold condition is met when a trust score of the external ecosystem 14 is below the trust threshold. In this condition, the dynamic rule set may set the connectivity path to indirect, via either the CHM 16 or the gateway module 20. The trust score may be based on a number of failed authentications and other connection errors, as well as a user-based review system.

Once the triggering condition clears (e.g., the OTA update completes or battery level recovers above the threshold), the CHM 16 may automatically restore the vehicle ECU’s device-type designation and/or the connectivity path to the initial connectivity configuration.

At step 110, the CHM 16 generates a revised connectivity configuration based on the dynamic rule set to each affected vehicle ECU 30. If the revised connectivity path is indirect, the CHM 16 or gateway module 20 operates as a protocol bridge that translates message payloads between a first protocol understood by the external ecosystem 14 and a second protocol used on the vehicle network 24. Translation preserves message semantics but may include frame re-packaging, address mapping, or encryption/de-encryption where required. The method 100 then proceeds to step 112.

At step 112, the CHM 16 re-allocates the network presence of each affected ECU 30 using the revised connectivity configuration. Re-allocating the network presence may include updating a registry entry on the external ecosystem 14 to reflect the ECU’s revised device-type designation, re-routing traffic through the CHM 16 or the gateway module 20 acting as a bridge, and/or temporarily blocking external traffic when the revised connectivity path is set to no external communication. The method 100 then ends.

The system 10 allows the CHM 16 to tailor each vehicle ECU’s 30 external visibility and communication protocol in real time, reducing cybersecurity exposure while preserving user functionality. By throttling or rerouting traffic when battery charge drops, network congestion rises, or an OTA update is underway, the system 10 safeguards power reserves and ensures uninterrupted software maintenance. The ability to translate between protocols further maximizes interoperability with diverse smart external ecosystems, letting the vehicle 12 integrate seamlessly.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A method for dynamically managing connectivity between a vehicle and an external ecosystem, the method comprising:

establishing, by a connectivity hub module (CHM) located in the vehicle, an initial connectivity configuration in which each of a plurality of vehicle electronic control units (ECUs) is registered on the external ecosystem with an initial device-type designation and an initial connectivity path that is one of a direct communication, an indirect communication through the CHM or a gateway module in the vehicle, or no external communication;

monitoring, by the CHM during an ongoing connectivity session between the vehicle and the external ecosystem, internal vehicle state data including at least a battery level, an over-the-air-update status, and a network traffic load, and monitoring external context data including at least an identity and a recent behavior of the external ecosystem;

applying, by the CHM, a dynamic rule set to at least one of the plurality of vehicle ECUs, wherein the dynamic rule set determines which of the device-type designation and the connectivity path should be changed for the at least one vehicle ECU based on the internal vehicle state data and the external context data;

generating a revised connectivity configuration based on application of the dynamic rule set, wherein the revised connectivity configuration includes a revised device-type designation corresponding to a different communications protocol than the initial communications protocol and/or a revised connectivity path chosen from the set of direct communication, indirect communication, or no external communication; and re-allocating, using the revised connectivity configuration, the at least one vehicle ECU's network presence on the external ecosystem by updating the ECU's device-type designation on the external ecosystem, and/or rerouting external messages destined for or originating from the at least one vehicle ECU through the CHM or the gateway module acting as a protocol bridge for when the connectivity path chosen is indirect communication.

2. The method of claim 1, wherein for the revised connectivity path set as indirect, the method further includes translating, by the CHM or the gateway module, messages exchanged between the external ecosystem and the ECU between a first protocol used by the external ecosystem and a second protocol used within a vehicle network.

3. The method of claim 1, wherein the monitoring further comprises detecting that at least one threshold condition has been met in the internal vehicle state data.

4. The method of claim 3, wherein the threshold condition is the battery level falling below a predefined battery limit.

5. The method of claim 3, wherein the threshold is the network-traffic load exceeding a predefined traffic limit.

6. The method of claim 3, wherein the threshold is the initiation of the over-the-air-update for the at least one vehicle ECU.

7. The method of claim 6, wherein the internal vehicle state data indicates that the at least one vehicle ECU is undergoing an over-the-air-update and the dynamic rule set selects the revised connectivity path as no external communication for the at least one vehicle ECU until the update is complete.

8. The method of claim 1, wherein the external context data further comprise a trust score for the external ecosystem.

9. The method of claim 8, wherein the dynamic rule set selects the revised connectivity path as indirect communication through the CHM or the gateway module when the trust score is below a predefined trust threshold.

10. A system in a vehicle for dynamically managing connectivity between the vehicle and an external ecosystem, the system comprising:

a plurality of vehicle ECUs;

a gateway module in communication with at least one of the plurality of ECUs; and a connectivity hub module (CHM) in communication with the plurality of vehicle ECUs, the CHM configured to:

establish an initial connectivity configuration in which each of a plurality of vehicle electronic control units (ECUs) is registered on the external ecosystem with an initial device-type designation and an initial connectivity path that is one of a direct communication, an indirect communication through the CHM or a gateway module in the vehicle, or no external communication;

monitor, during an ongoing connectivity session between the vehicle and the external ecosystem, an internal vehicle state data including at least a battery level, an over-the-air-update status, and a network traffic load, and monitoring external context data including at least an identity and a recent behavior of the external ecosystem;

apply a dynamic rule set to at least one of the plurality of vehicle ECUs, wherein the dynamic rule set determines which of the device-type designation and the connectivity path should be changed for the at least one vehicle ECU based on the internal vehicle state data and the external context data;

generate a revised connectivity configuration based on application of the dynamic rule set, wherein the revised connectivity configuration includes a revised device-type designation corresponding to a different communications protocol than the initial communications protocol and/or a revised connectivity path chosen from the set of direct communication, indirect communication, or no external communication; and re-allocate, using the revised connectivity configuration, the at least one vehicle ECU's network presence on the external ecosystem by updating the ECU's device-type designation on the external ecosystem, and/or rerouting external messages destined for or originating from the at least one vehicle ECU through the CHM or the gateway module acting as a protocol bridge for when the connectivity path chosen is indirect communication.

11. The system of claim 10, wherein, when the revised connectivity path is indirect communication, the CHM or the gateway module is further configured to translate messages exchanged between the external ecosystem and the at least one ECU between a first protocol used by the external ecosystem and a second protocol used within the vehicle network.

12. The system of claim 10, wherein the CHM is further configured to detect that at least one threshold condition has been met in the internal vehicle state data.

13. The system of claim 12, wherein the threshold condition comprises the battery level falling below a predefined battery limit.

14. The system of claim 12, wherein the threshold condition comprises the network-traffic load exceeding a predefined traffic limit.

15. The system of claim 12, wherein the threshold condition comprises initiation of an over-the-air update for the at least one ECU.

16. The system of claim 15, wherein, when the internal vehicle state data indicate that the at least one ECU is undergoing an over-the-air update, the dynamic rule set selects the revised connectivity path as no external communication for the at least one ECU until the update is complete.

17. The system of claim 10, wherein the external context data further comprise a trust score for the external ecosystem, and the dynamic rule set selects the revised connectivity path as indirect communication through the CHM or the gateway module when the trust score is below a predefined trust threshold.

18. A tangible, non-transitory, machine-readable medium, comprising machine-readable instructions, that when executed by a processor, cause the processor to:

establish, by a connectivity hub module (CHM) located in a vehicle, an initial connectivity configuration in which each of a plurality of vehicle electronic control units (ECUs) is registered on an external ecosystem with an initial device-type designation and an initial connectivity path that is one of a direct communication, an indirect communication through the CHM or a gateway module in the vehicle, or no external communication;

monitor, by the CHM during an ongoing connectivity session between the vehicle and the external ecosystem, an internal vehicle state data including at least a battery level, an over-the-air-update status, and a network traffic load, and monitoring external context data including at least an identity and a recent behavior of the external ecosystem;

apply, by the CHM, a dynamic rule set to at least one of the plurality of vehicle ECUs, wherein the dynamic rule set determines which of the device-type designation and the connectivity path should be changed for the at least one vehicle ECU based on the internal vehicle state data and the external context data;

generate a revised connectivity configuration based on application of the dynamic rule set, wherein the revised connectivity configuration includes a revised device-type designation corresponding to a different communications protocol than the initial communications protocol and/or a revised connectivity path chosen from the set of direct communication, indirect communication, or no external communication; and re-allocate, using the revised connectivity configuration, the at least one vehicle ECU's network presence on the external ecosystem by updating the ECU's device-type designation on the external ecosystem, and/or rerouting external messages destined for or originating from the at least one vehicle ECU through the CHM or the gateway module acting as a protocol bridge for when the connectivity path chosen is indirect communication.

19. The tangible, non-transitory, machine-readable medium, comprising machine-readable instructions of claim 18, that when executed by a processor, cause the processor to:

translate messages exchanged between the external ecosystem and the at least one ECU between a first protocol used by the external ecosystem and a second protocol used within the vehicle network when the revised connectivity path is indirect communication.

20. The tangible, non-transitory, machine-readable medium, comprising machine-readable instructions of claim 18, that when executed by a processor, cause the processor to:

detect that at least one threshold condition has been met in the internal vehicle state data and the external context data.

* * * * *